(12) United States Patent
Seo et al.

(10) Patent No.: US 12,075,689 B2
(45) Date of Patent: Aug. 27, 2024

(54) DISPLAY DEVICE HAVING FLEXIBLE SUPPORT MEMBER HAVING OPENINGS

(71) Applicant: Samsung Display Co., LTD., Yongin-si (KR)

(72) Inventors: Dongwoo Seo, Suwon-si (KR); Dong Jin Park, Seongnam-si (KR); Jai Ku Shin, Hwaseong-si (KR); Sung-Chul Choi, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/713,159

(22) Filed: Apr. 4, 2022

(65) Prior Publication Data

US 2022/0231241 A1 Jul. 21, 2022

Related U.S. Application Data

(63) Continuation of application No. 16/819,366, filed on Mar. 16, 2020, now Pat. No. 11,296,286.

(30) Foreign Application Priority Data

Jun. 25, 2019 (KR) .................. 10-2019-0075942

(51) Int. Cl.
  *H10K 77/10* (2023.01)
  *B32B 7/12* (2006.01)
  *H10K 59/12* (2023.01)
  *H10K 102/00* (2023.01)

(52) U.S. Cl.
  CPC .............. *H10K 77/111* (2023.02); *B32B 7/12* (2013.01); *H10K 59/12* (2023.02); *B32B 2457/20* (2013.01); *H10K 2102/311* (2023.02)

(58) Field of Classification Search
  CPC .... H01L 51/0097; H01L 27/3244; B32B 7/12
  See application file for complete search history.

(56) References Cited

U.S. PATENT DOCUMENTS

| 9,012,785 | B2 | 4/2015 | Otsubo | |
| 11,031,563 | B1* | 6/2021 | Li | H01L 51/0097 |
| 2016/0218305 | A1* | 7/2016 | Kim | H01L 51/0097 |
| 2016/0324023 | A1 | 11/2016 | Kim et al. | |
| 2017/0263890 | A1* | 9/2017 | Chun | H01L 51/0097 |

(Continued)

FOREIGN PATENT DOCUMENTS

| CN | 107180849 A | 9/2017 |
| CN | 107437378 | 12/2017 |

(Continued)

OTHER PUBLICATIONS

Extended European Search Report dated Aug. 28, 2020 in the European Patent Application No. 20181422.5.

(Continued)

*Primary Examiner* — Michael Jung
(74) *Attorney, Agent, or Firm* — CANTOR COLBURN LLP

(57) ABSTRACT

A display device including a display panel having a foldable area, a support member disposed on a bottom surface of the display panel and including a plurality of openings formed in the foldable area, and an elastic member disposed on a bottom surface of the support member and overlapping the openings in the foldable area.

17 Claims, 9 Drawing Sheets

(56) References Cited

U.S. PATENT DOCUMENTS

| | | |
|---|---|---|
| 2018/0097197 A1 | 4/2018 | Han et al. |
| 2018/0145125 A1 | 5/2018 | Lee et al. |
| 2018/0192527 A1 | 7/2018 | Yun et al. |
| 2018/0307338 A1 | 10/2018 | Park |
| 2018/0350701 A1 | 12/2018 | Kim et al. |
| 2019/0005857 A1* | 1/2019 | Wakata .................... H05K 5/02 |
| 2019/0036068 A1 | 1/2019 | Kim et al. |
| 2019/0067606 A1* | 2/2019 | Han .................... H01L 51/0097 |
| 2019/0141843 A1 | 5/2019 | Park et al. |
| 2019/0165311 A1 | 5/2019 | Lee |
| 2019/0237689 A1* | 8/2019 | Liu .................... H01L 51/5225 |
| 2020/0047451 A1* | 2/2020 | Dong .................... B32B 27/365 |
| 2020/0152096 A1 | 5/2020 | Jia |
| 2020/0273379 A1* | 8/2020 | Wang .................... G09F 9/301 |
| 2020/0295282 A1* | 9/2020 | Xiang .................... H01L 51/0097 |
| 2021/0118337 A1* | 4/2021 | Park .................... G09F 9/301 |
| 2021/0174711 A1* | 6/2021 | Cho .................... H10K 59/40 |
| 2022/0103670 A1* | 3/2022 | Liao .................... H04M 1/0216 |

FOREIGN PATENT DOCUMENTS

| | | |
|---|---|---|
| CN | 107567608 A | 1/2018 |
| CN | 108665804 | 10/2018 |
| CN | 109036133 | 12/2018 |
| CN | 109423226 A | 3/2019 |
| CN | 109545087 | 3/2019 |
| CN | 109616018 A | 4/2019 |
| EP | 3301506 A1 | 4/2018 |
| KR | 1020130118483 A | 10/2013 |
| KR | 10-2016-0144912 | 12/2016 |
| KR | 10-2017-0063344 | 6/2017 |
| KR | 10-1834793 | 3/2018 |
| KR | 10-2019-0049454 | 5/2019 |
| KR | 10-2019-0064183 | 6/2019 |
| KR | 1020190065640 A | 6/2019 |

OTHER PUBLICATIONS

Non-Final Office Action mailed May 7, 2021, in U.S. Appl. No. 16/819,366.

Final Office Action mailed Sep. 15, 2021, in U.S. Appl. No. 16/819,366.

Notice of Allowance issued Nov. 29, 2021, in U.S. Appl. No. 16/819,366.

* cited by examiner

FIG. 4
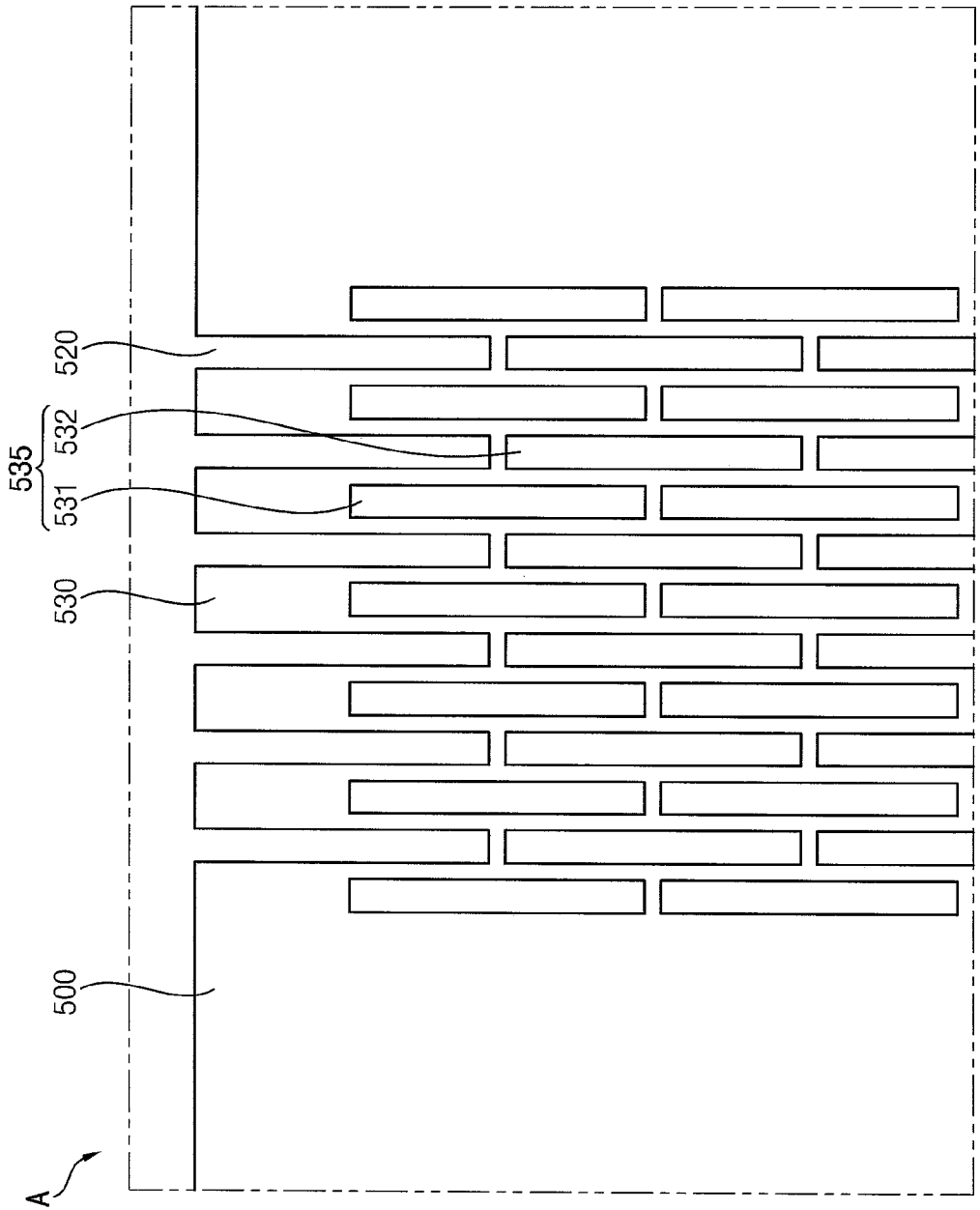
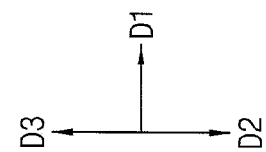

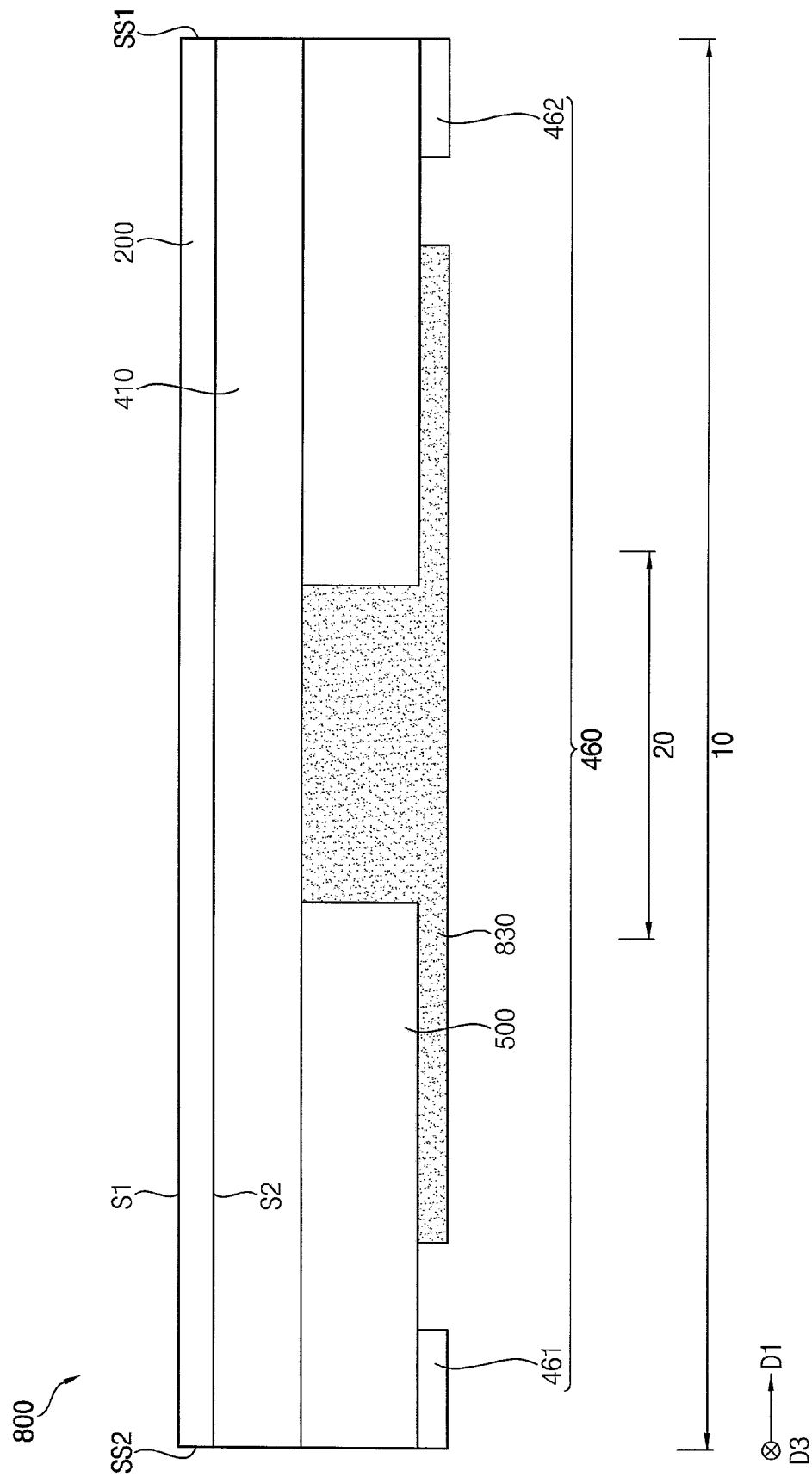

DISPLAY DEVICE HAVING FLEXIBLE SUPPORT MEMBER HAVING OPENINGS

CROSS-REFERENCE TO RELATED APPLICATIONS

This application is a continuation of U.S. patent application Ser. No. 16/819,366, filed on Mar. 16, 2020, which claims priority from and the benefit of Korean Patent Application No. 10-2019-0075942, filed on Jun. 25, 2019, each of which is hereby incorporated by reference for all purposes as if fully set forth herein.

BACKGROUND

Field

Exemplary embodiments relate generally to a display device and, more particularly, to a flexible display device.

Discussion of the Background

Flat panel display devices are used as display devices and replacing a cathode ray tube display device due to lightweight and thin characteristics thereof. Flat panel display devices may include a liquid crystal display device and an organic light emitting diode display device, for example.

Recently, flexible display devices have been developed, in which a lower substrate and an upper substrate of a display panel included the display device may include a flexible material, such that a portion of the display panel may be bent or folded. For example, the lower substrate included in the display panel may be formed of a polyimide substrate, and the upper substrate included in the display panel may have a thin film encapsulation structure. In addition, the flexible display devices may display an image even in a portion where the display panel is folded. In particular, the flexible display device may include a display area, in which an image is displayed, and a portion of the display area may be folded. The flexible display device may further include a support member disposed on a bottom surface of the display panel and including a plurality of openings. The openings of the support member may overlap the portion where the display panel is folded. However, when foreign substances penetrate into the openings while the flexible display device is folded and unfolded, the flexible display device may have defects at the folded portion.

The above information disclosed in this Background section is only for understanding of the background of the inventive concepts, and, therefore, it may contain information that does not constitute prior art.

SUMMARY

Display devices constructed according to exemplary embodiments of the invention are capable of preventing defects in a foldable area.

Additional features of the inventive concepts will be set forth in the description which follows, and in part will be apparent from the description, or may be learned by practice of the inventive concepts.

A display device according to an exemplary embodiment includes a display panel having a foldable area, a support member disposed on a bottom surface of the display panel and including a plurality of openings formed in the foldable area, and an elastic member disposed on a bottom surface of the support member and overlapping the openings in the foldable area.

The display panel may further include a display area, and a portion of the display area may be defined as the foldable area.

The openings of the support member may include first to nth openings arranged in a first direction parallel to a top surface of the display panel, in which n is an integer of 1 or more, and a kth opening may be disposed at a position shifted in a second direction perpendicular to the first direction, in which k is an even number between 1 and n.

The support member may further include protrusions disposed in a third direction opposite to the second direction with respect to each of (k−1)th and (k+1)th openings, among the first to nth openings.

A space between two adjacent protrusions may be defined as a trench, and the elastic member may extend to a side surface of the support member to cover the trench.

The display device may further include a first step difference compensation member disposed at a first portion on the bottom surface of the support member, and a second step difference compensation member disposed at a second portion on the bottom surface of the support member.

A bottom surface of each of the first and second step difference compensation members may be disposed at a same level as a bottom surface of the elastic member.

The display device may further include a first adhesive member disposed between the support member and the elastic member.

The first adhesive member may contact the support member and the elastic member to cover the openings.

The display device may further include a shock absorbing member disposed between the support member and the display panel.

The display device may further include a second adhesive member disposed between the shock absorbing member and the support member, and a third adhesive member disposed between the display panel and the shock absorbing member.

The second adhesive member may contact the shock absorbing member and the support member to cover the openings.

The third adhesive member may contact the display panel and the shock absorbing member.

The display device may further include a first metal member disposed at a first portion on a bottom surface of the elastic member, and a second metal member disposed at a second portion on the bottom surface of the elastic member while being spaced apart from the first metal member.

Each of the first and second portions may partially overlap the foldable area.

The display device may further include a fourth adhesive member disposed between the first metal member and the elastic member, and a fifth adhesive member disposed between the second metal member and the elastic member while being spaced apart from the fourth adhesive member.

The display device may further include a first step difference compensation member disposed at the first portion on the bottom surface of the support member, and a second step difference compensation member disposed at the second portion on the bottom surface of the support member.

A bottom surface of each of the first and second step difference compensation members may be disposed at a same level as a bottom surface of each of the first and second metal members.

The elastic member may be configured to extend to cover the openings of the support member disposed in the foldable area when the display panel is folded.

The opening may include an empty space.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 4 is an enlarged cross-sectional view showing region A of the display device of FIG. 1.

FIG. 9 is a side view showing a lateral side of the display device of FIG. 7.

DETAILED DESCRIPTION

Figure 1:
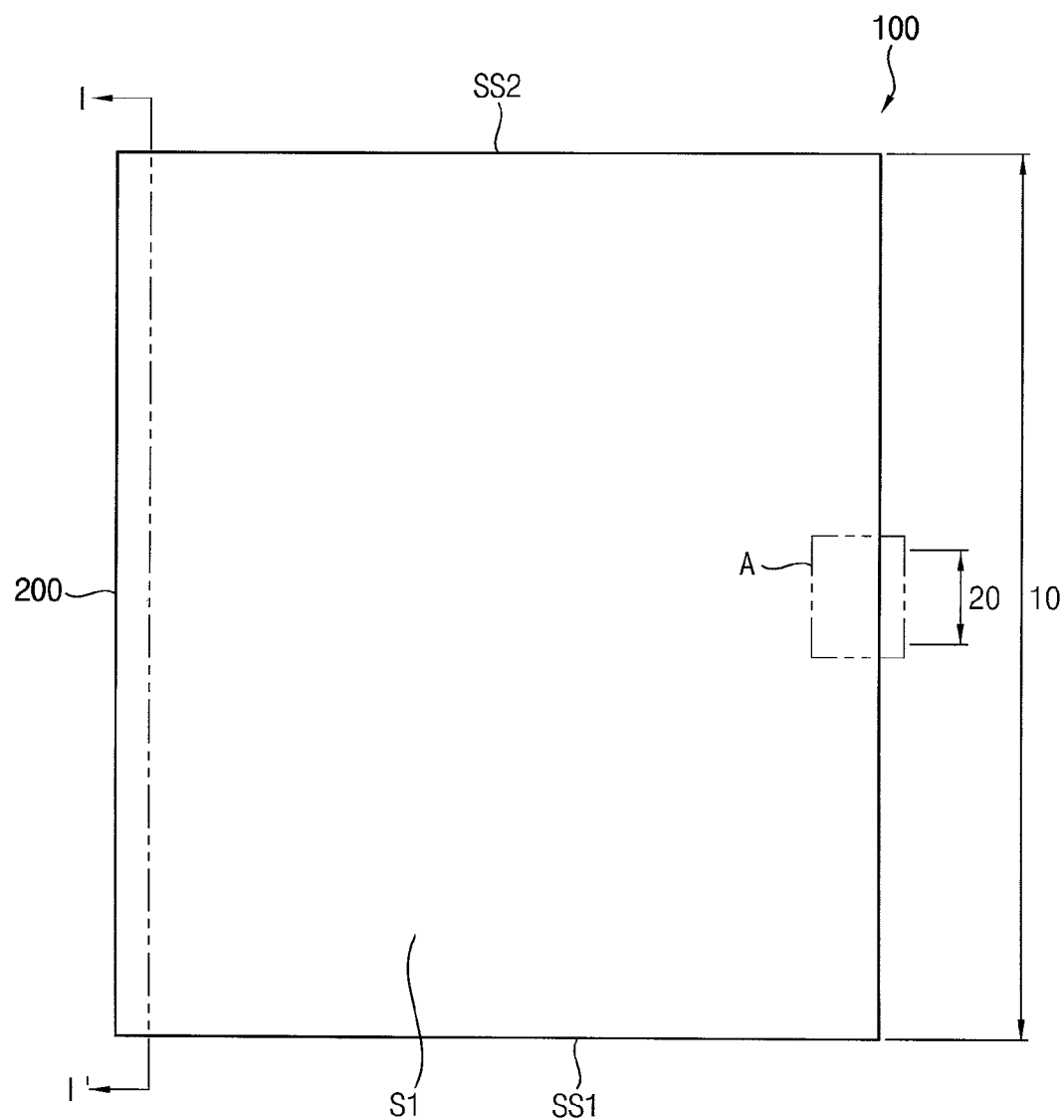
FIG. 1 is a plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices according to exemplary embodiments of the invention will be described in detail with reference to the accompanying drawings. In the accompanying drawings, same or similar reference numerals refer to the same or similar elements.

Figure 2:
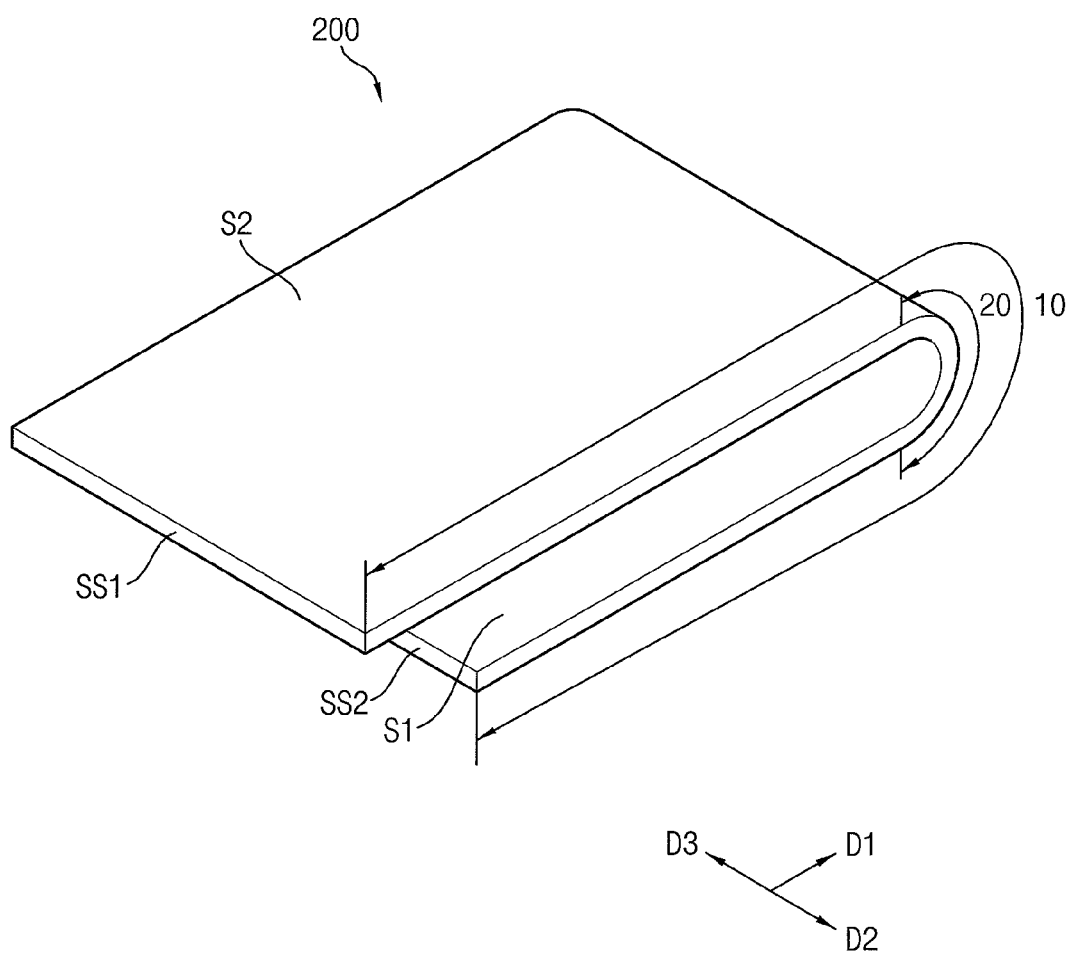
FIG. 2 is a perspective view showing a folded shape of a display panel included in the display device of FIG. 1.
Figure 3:
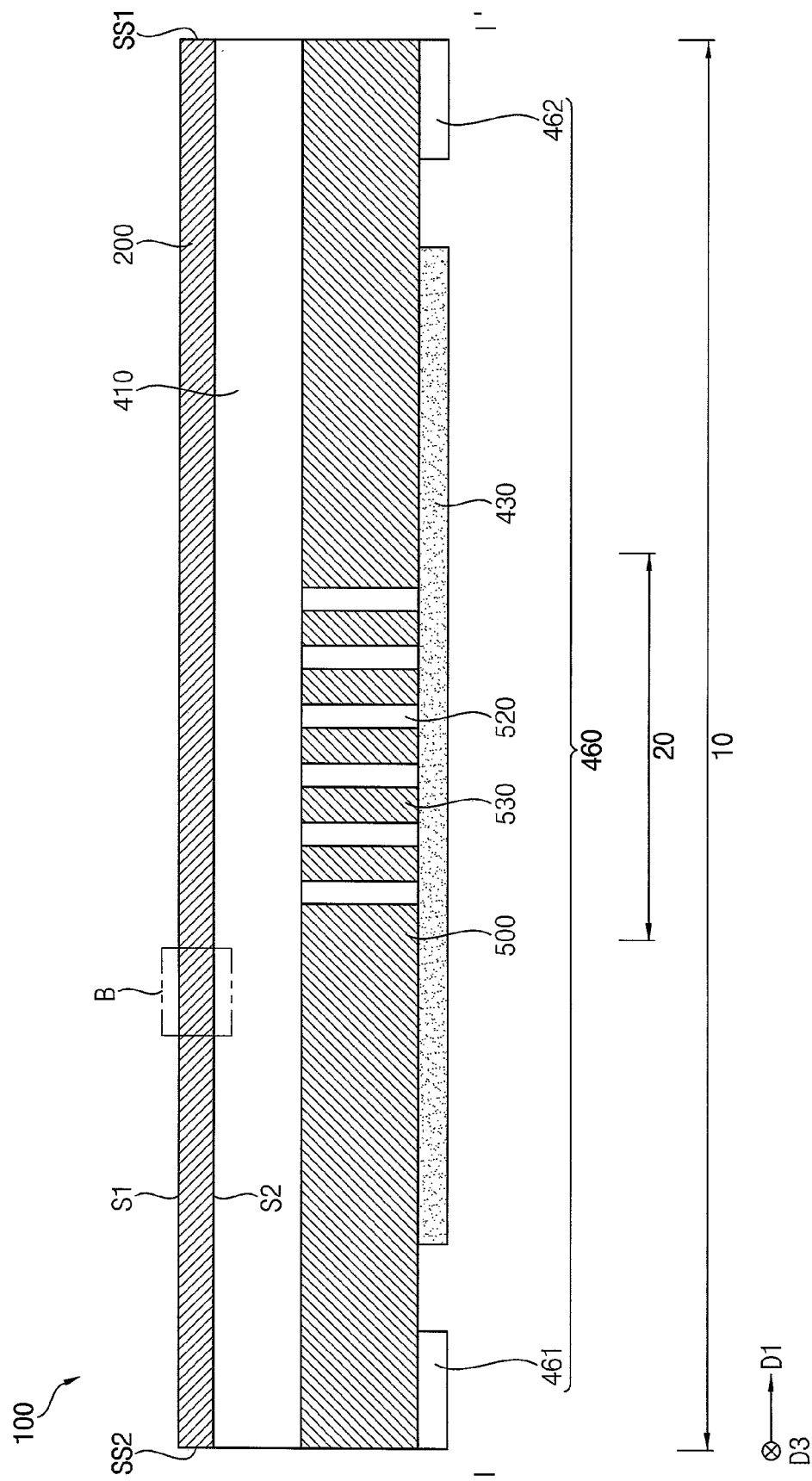
FIG. 3 is a cross-sectional view taken along line I-I' of FIG. 1.

FIG. 1 is a plan view of a display device according to an exemplary embodiment. FIG. 2 is a perspective view showing a folded shape of a display panel included in the display device of FIG. 1. FIG. 3 is a cross-sectional view taken along line I-I' of FIG. 1. FIG. 4 is an enlarged cross-sectional view showing region A of the display device of FIG. 1. For example, FIGS. 1 and 3 show a state in which a display device 100 is unfolded.

Referring to FIGS. 1, 2, 3, and 4, the display device 100 may include a display panel 200, a shock absorbing member 410, a support member 500, an elastic member 430, a step difference compensation member 460, and the like. In this case, as shown in FIG. 1, the display device 100 may include a display area 10 and a foldable area 20. The display area 10 is an area where an image is displayed from the display panel 200, and the foldable area 20 is an area where the display device 100 is folded or unfolded. A portion of the display area 10 may be defined in the foldable area 20. In addition, as shown in FIG. 3, the step difference compensation member 460 may include a first step difference compensation member 461 and a second step difference compensation member 462. Furthermore, as shown in FIGS. 3 and 4, a plurality of openings 535, a plurality of protrusions 530, and a plurality of trenches 520 may be formed in the support member 500.

Referring back to FIGS. 1, 2, and 3, the display panel 200 may be provided. The display panel 200 may include a plurality of sub-pixels, and may display an image through the sub-pixels. For example, the display panel 200 may have a first surface S1 on which an image is displayed, and a second surface S2 facing the first surface S1. In addition, the display panel 200 may have a first side surface SS1 and a second side surface SS2 facing the first side surface SS1. As shown in FIG. 2, when the display panel 200 located in the foldable area 20 is folded, the first side surface SS1 and the second side surface SS2 may become adjacent to each other. In addition, the display panel 200 located in the foldable area 20 may have a curved shape. In this case, the first surface S1 may be located on an inner side, and the second surface S2 may be located on an outer side. Alternatively, in some exemplary embodiments, the display panel 200 may be folded, such that the first surface S1 is located on the outer side and the second surface S2 is located on the inner side.

The shock absorbing member 410 may be disposed on the second surface S2 of the display panel 200. In particular, the shock absorbing member 410 may be disposed between the support member 500 and the display panel 200. The shock absorbing member 410 may protect the display panel 200 from an external impact. In addition, the shock absorbing member 410 may include a flexible material so that the display panel 200 may be easily folded. For example, the shock absorbing member 410 may include a material in the form of a foam, such as a polyurethane foam, a polystyrene foam, or the like.

Referring back to FIGS. 3 and 4, the support member 500 may be disposed on a bottom surface of the shock absorbing member 410. In particular, the support member 500 may be disposed on the second surface S2 of the display panel 200, and may include a plurality of openings 535 formed in the foldable area 20. In the illustrated exemplary embodiment, the openings 535 may include openings 531 arranged in a first direction D1 parallel to a top surface of the display device 100, and openings 532 shifted in a second direction D2 orthogonal to the first direction D1 and arranged in the first direction D1. In addition, the support member 500 may further include a plurality of protrusions 530 protruding in a third direction D3 opposite to the second direction D2. Furthermore, a space between two adjacent protrusions among the protrusions 530 may define a trench 520.

For example, the openings 535 may include first to $n^{th}$ openings (where n is an integer of 1 or more) arranged in the first direction D1, and a $k^{th}$ opening (where k is an even number between 1 and n) among the first to $n^{th}$ openings may be located at a position shifted in a second direction perpendicular to the first direction. In addition, the support member 500 may further include protrusions 530 located in the third direction D3 with respect to each of $(k-1)^{th}$ and $(k+1)^{th}$ openings among the first to $n^{th}$ openings, and the trench 520 may be defined by the protrusions 530.

The support member 500 may support the display panel 200, and may also assist the display panel 200 to be folded. For example, the support member 500 may be disposed over the second surface S2 of the display panel 200 to support the display panel 200, and the openings 535 formed in the foldable area 20 may assist the display panel 200 to be folded. The openings 535 may be configured as an empty space. In addition, when the display device 100 is folded, a shape of each of the openings 535 may be deformed. For example, when each of the openings 535 has a geometric shape as illustrated in FIG. 4, the support member 500 located in the foldable area 20 may be deformed in a longitudinal direction (e.g., first direction D1) without being deformed in a depth direction (e.g., a direction from the support member 500 toward the display panel 200).

The support member 500 may include metal or plastic having a relatively large elastic force or a relatively large restoring force. According to an exemplary embodiment, the support member 500 may include steel use stainless (SUS). In some exemplary embodiments, however, the support member 500 may include alloys (e.g., superelastic metals), such as nickel-titanium (Ni—Ti), nickel-aluminum (Ni—Al), copper-zinc-nickel (Cu—Zn—Ni), copper-aluminum-nickel (Cu—Al—Ni), copper-aluminum-manganese (Cu—Al—Mn), titanium-nickel-copper-molybdenum (Ti—Ni—Cu—Mo), cobalt-nickel-gallium:iron (Co—Ni—Ga:Fe), silver-nickel (Ag—Ni), gold-cadmium (Au—Cd), iron-platinum (Fe—Pt), iron-nickel (Fe—Ni), and indium-cadmium (In—Cd).

Although each of the openings 535 has been described as having a rectangular shape when viewed in a plan view, the inventive concepts are not limited to a particular shape of each of the openings 535. For example, each of the openings 535 may have substantially a triangular shape, a rhombic shape, a polygonal shape, a circular shape, a track shape, or an elliptical shape, when viewed from a plan view.

The elastic member 430 may be disposed at a portion of a bottom surface of the support member 500. In particular, the elastic member 430 may overlap the openings 535 in the foldable area 20 on the bottom surface of the support member 500. As such, the elastic member 430 may prevent the openings 535 from being exposed. According to an exemplary embodiment, the elastic member 430 may not be disposed inside each of the openings 535, such that the openings 535 may be configured as empty spaces. While the display device 100 is repeatedly folded and unfolded, the elastic member 430 may prevent foreign substances from penetrating into the openings 535 and the trench 520. In addition, while the display device 100 is repeatedly folded and unfolded, the elastic member 430 may be extended and contracted to prevent the openings 535 from being exposed. The elastic member 430 may include an elastomer having a relatively large elastic force or a relatively large restoring force. For example, the elastic member 430 may include an elastic material, such as silicone, urethane, or thermoplastic polyurethane (TPU).

For example, when a conventional display device is repeatedly folded and unfolded, foreign substances may penetrate into the openings 535. The penetrated foreign substances may not escape out of the openings 535. In this case, due to the foreign substances, the support member 500 located in the foldable area 20 may be damaged, or the shapes of the openings 535 may be deformed, which may cause defects in the foldable area 20 of the conventional display device.

According to an exemplary embodiment, the elastic member 430 is disposed on the openings 535 to prevent the openings 535 from being exposed to prevent the foreign substances from being located in the openings 535.

The step difference compensation member 460 may be disposed on the bottom surface of the support member 500 while being spaced apart from the elastic member 430. For example, the first step difference compensation member 461 may be disposed at a first portion on the bottom surface of the support member 500, and the second step difference compensation member 462 may be disposed at a second portion on the bottom surface of the support member 500. According to an exemplary embodiment, a bottom surface of the step difference compensation member 460 may be located at the same level as a bottom surface of the elastic member 430. The step difference compensation member 460 may prevent the display panel 200 from sagging at a portion where the elastic member 430 is not disposed. The step difference compensation member 460 may include polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyether sulfone (PES), polyarylate (PAR), polycarbonate oxide (PCO), modified polyphenylene oxide (MPPO), etc.

The display device 100 according to an exemplary embodiment includes the elastic member 430 disposed on the openings 535 to prevent the openings 535 from being exposed, such that the foreign substances may not be located in the openings 535. In this manner, defects may not occur in the foldable area 20 of the display device.

Figure 5:
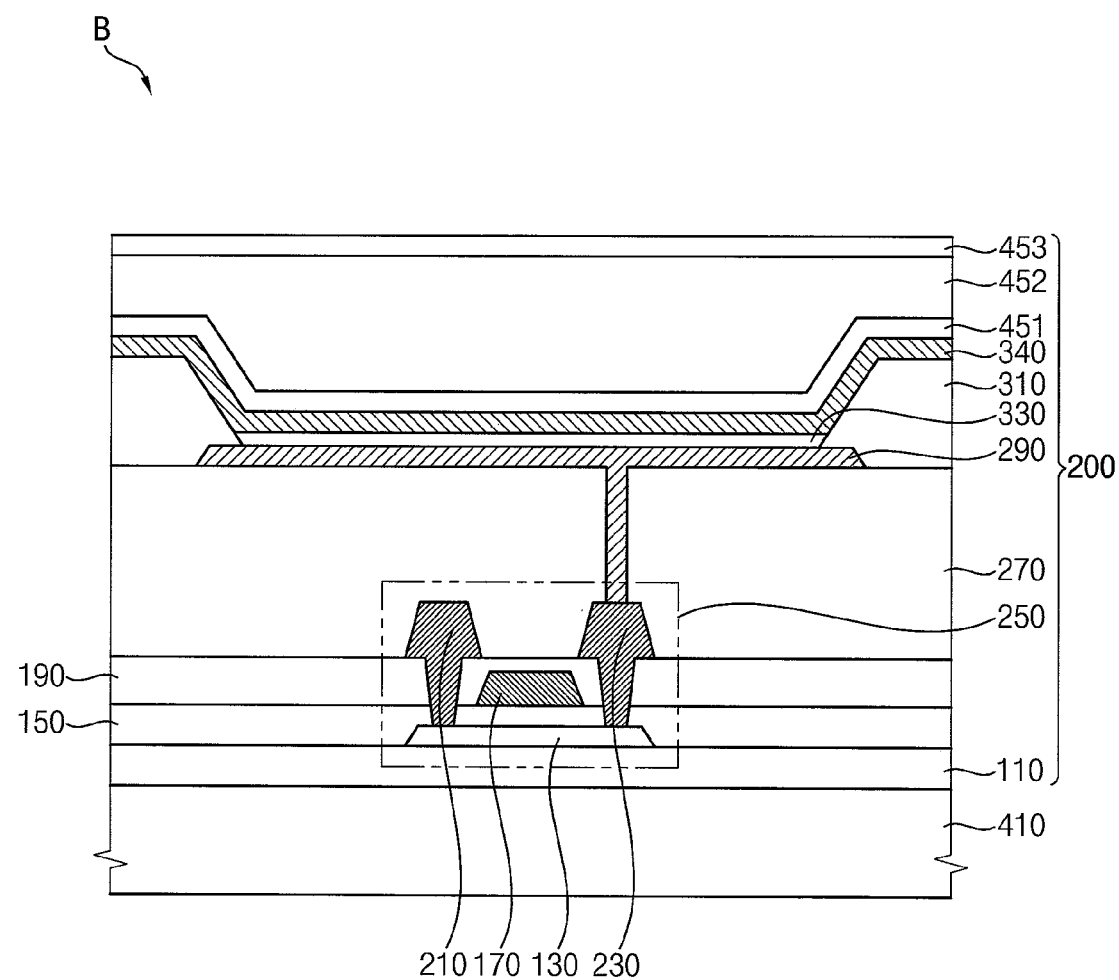
FIG. 5 is an enlarged cross-sectional view showing region B of the display device of FIG. 3.

FIG. 5 is an enlarged cross-sectional view showing region B of the display device of FIG. 3.

The display panel 200 may include a substrate 110, a semiconductor element 250, a planarization layer 270, a lower electrode 290, a pixel defining layer 310, a light emitting layer 330, an upper electrode 340, a first thin film encapsulation layer 451, a second thin film encapsulation layer 452, a third thin film encapsulation layer 453, and the like. The semiconductor element 250 may include an active layer 130, a gate insulating layer 150, a gate electrode 170, an interlayer insulating layer 190, a source electrode 210, and a drain electrode 230.

The substrate 110 may include a transparent or opaque material. In some exemplary embodiments, the substrate 110 may be disposed on a lower protective film. The substrate 110 may be formed of a transparent resin substrate, such as a polyimide substrate. In this case, the polyimide substrate may include a first polyimide layer, a barrier film layer, a second polyimide layer, and the like. In other exemplary embodiments, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, etc.

A buffer layer may be disposed on the substrate 110. The buffer layer may prevent metal atoms or impurities from diffusing from the substrate 110 to the semiconductor element 250, and may control a heat transfer rate during a crystallization process for forming the active layer 130 to obtain a substantially uniform active layer 130. In addition, when a surface of the substrate 110 is not uniform, the buffer layer may improve flatness of the surface of the substrate 110. Depending on a type of the substrate 110, at least two buffer layers may be provided on the substrate 110, or the buffer layer may be omitted. For example, the buffer layer may include an organic material or an inorganic material.

The active layer 130 may be disposed on the substrate 110. The active layer 130 may include a metal oxide semiconductor, an inorganic semiconductor (e.g., amorphous silicon or poly silicon semiconductor), an organic semiconductor, etc. The active layer 130 may have source and drain regions.

The gate insulating layer 150 may be disposed on the active layer 130. For example, the gate insulating layer 150 may sufficiently cover the active layer 130 on the substrate 110, and may have a substantially flat top surface without creating a step around the active layer 130. In some exemplary embodiments, the gate insulating layer 150 may be disposed along a profile of the active layer 130 with a substantially uniform thickness to cover the active layer 130 on the substrate 110. The gate insulating layer 150 may include a silicon compound, metal oxide, etc. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. In other exemplary embodiments, the gate insulating layer 150 may have a multilayer structure including a plurality of insulating layers. For example, the insulating layers may have different thicknesses and/or may include different materials.

The gate electrode 170 may be disposed on the gate insulating layer 150. The gate electrode 170 may be disposed at a portion of the gate insulating layer 150, under which the active layer 130 is located. The gate electrode 170 may include metal, an alloy, metal nitride, conductive metal oxide, a transparent conductive material, etc. For example, the gate electrode 170 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in combination with each other. In other exemplary embodiments, the gate electrode 170 may have a multilayer structure including a plurality of metal layers. For example, the metal layers may have different thicknesses and/or may include different materials.

The interlayer insulating layer 190 may be disposed on the gate electrode 170. The interlayer insulating layer 190 may sufficiently cover the gate electrode 170 on the gate insulating layer 150, and may have a substantially flat top surface without creating a step around the gate electrode 170. In some exemplary embodiments, the interlayer insulating layer 190 may be disposed along a profile of the gate electrode 170 with a substantially uniform thickness to cover the gate electrode 170 on the gate insulating layer 150. The interlayer insulating layer 190 may include a silicon compound, metal oxide, etc. In some exemplary embodiments, the interlayer insulating layer 190 may have a multilayer structure including a plurality of insulating layers. For example, the insulating layers may have different thicknesses and/or may include different materials.

The source electrode 210 and the drain electrode 230 may be disposed on the interlayer insulating layer 190. The source electrode 210 may be connected to the source region of the active layer 130 through a contact hole formed by removing first parts of the gate insulating layer 150 and the interlayer insulating layer 190, and the drain electrode 230 may be connected to the drain region of the active layer 130 through a contact hole formed by removing second parts of the gate insulating layer 150 and the interlayer insulating layer 190. Each of the source electrode 210 and the drain electrode 230 may include metal, an alloy, metal nitride, conductive metal oxide, a transparent conductive material, etc. These may be used alone or in combination with each other. In other exemplary embodiments, each of the source electrode 210 and the drain electrode 230 may have a multilayer structure including a plurality of metal layers. For example, the metal layers may have different thicknesses and/or may include different materials.

Accordingly, the semiconductor element 250 including the active layer 130, the gate insulating layer 150, the gate electrode 170, the interlayer insulating layer 190, the source electrode 210, and the drain electrode 230 may be provided.

Although the semiconductor element 250 has been described as having a top gate structure, the inventive concept are not limited thereto. For example, in some exemplary embodiments, the semiconductor element 250 may have a bottom gate structure, a double gate structure, etc.

In addition, although the display device 100 has been described as including one semiconductor element, the inventive concepts are not limited thereto. For example, the display device 100 may include at least one semiconductor element and at least one storage capacitor.

The planarization layer 270 may be disposed on the interlayer insulating layer 190, the source electrode 210, and the drain electrode 230. For example, the planarization layer 270 may have a relatively thick thickness. In this case, the planarization layer 270 may have a substantially flat top surface. In order to implement such a flat top surface of the planarization layer 270, a planarization process may be additionally performed on the planarization layer 270. In some exemplary embodiments, the planarization layer 270 may be disposed along a profile of the source electrode 210 and the drain electrode 230 with a substantially uniform thickness on the interlayer insulating layer 190. The planarization layer 270 may be formed of an organic material or an inorganic material. In an exemplary embodiment, the planarization layer 270 may include an organic material. For example, the planarization layer 270 may include a photoresist, a polyacryl-based resin, a polyimide-based resin, a polyamide-based resin, a siloxane-based resin, an acryl-based resin, an epoxy-based resin, etc.

The lower electrode 290 may be disposed on the planarization layer 270. The lower electrode 290 may be connected to the drain electrode 230 through a contact hole formed by removing a portion of the planarization layer 270, such that the lower electrode 290 may be electrically connected to the semiconductor element 250. The lower electrode 290 may include metal, an alloy, metal nitride, conductive metal oxide, a transparent conductive material, etc. These may be used alone or in combination with each other. In other exemplary embodiments, the lower electrode 290 may have a multilayer structure including a plurality of metal layers. For example, the metal layers may have different thicknesses and/or may include different materials.

The pixel defining layer 310 may be disposed on the planarization layer 270. For example, the pixel defining layer 310 may expose a portion of a top surface of the lower electrode 290 while covering both sides of the lower electrode 290. The pixel defining layer 310 may be formed of an organic material or an inorganic material. In the illustrated exemplary embodiment, the pixel defining layer 310 may include an organic material.

The light emitting layer 330 may be disposed on the pixel defining layer 310 and the lower electrode 290. The light emitting layer 330 may be formed by using at least one of light emitting materials for emitting different colors of light (e.g., red light, green light, blue light, etc.) according to sub-pixels. Alternatively, the light emitting layer 330 may be formed by laminating a plurality of light emitting materials for emitting different colors of light, such as red light, green light, and blue light to emit white light as a whole. In this case, a color filter may be disposed on the light emitting layer 330 that is disposed on the lower electrode 290. The color filter may include at least one of a red color filter, a green color filter, and a blue color filter. In some exemplary embodiments, the color filter may include a yellow color filter, a cyan color filter, and a magenta color filter, for example. The color filter may include a photosensitive resin or a color photoresist.

The upper electrode 340 may be disposed on the light emitting layer 330 and the pixel defining layer 310. The upper electrode 340 may include metal, an alloy, metal nitride, conductive metal oxide, a transparent conductive material, etc. These may be used alone or in combination with each other. In other exemplary embodiments, the upper electrode 340 may have a multilayer structure including a plurality of metal layers. For example, the metal layers may have different thicknesses and/or may include different materials.

The first thin film encapsulation layer 451 may be disposed on the upper electrode 340. The first thin film encapsulation layer 451 may be disposed along a profile of the upper electrode 340 with a substantially uniform thickness to cover the upper electrode 340. The first thin film encapsulation layer 451 may prevent the light emitting layer 330 from being deteriorated due to penetration of moisture, oxygen, or the like. In addition, the first thin film encapsulation layer 451 may also protect the display panel 200 from an external impact. The first thin film encapsulation layer 451 may include inorganic materials having flexibility.

The second thin film encapsulation layer 452 may be disposed on the first thin film encapsulation layer 451. The second thin film encapsulation layer 452 may improve flatness of the display panel 200 and protect the display panel 200. The second thin film encapsulation layer 452 may include organic materials having flexibility.

The third thin film encapsulation layer 453 may be disposed on the second thin film encapsulation layer 452. The third thin film encapsulation layer 453 may be disposed along a profile of the second thin film encapsulation layer 452 with a substantially uniform thickness to cover the second thin film encapsulation layer 452. The third thin film encapsulation layer 453 may prevent the light emitting layer 330 from being deteriorated due to the penetration of moisture, oxygen, or the like together with the first thin film encapsulation layer 451. In addition, the third thin film encapsulation layer 453 may also protect the display panel 200 from an external impact together with the first thin film encapsulation layer 451 and the second thin film encapsulation layer 452. The third thin film encapsulation layer 453 may include inorganic materials having flexibility.

Accordingly, the display panel 200 including the substrate 110, the semiconductor element 250, the planarization layer 270, the lower electrode 290, the pixel defining layer 310, the light emitting layer 330, the upper electrode 340, the first thin film encapsulation layer 451, the second thin film encapsulation layer 452, and the third thin film encapsulation layer 453 may be provided.

Although the display device 100 according to the illustrated exemplary embodiment has been described as being an organic light emitting diode display device, the inventive concepts are not limited thereto. In other exemplary embodiments, the display device 100 may include a liquid crystal display device (LCD), a field emission display device (FED), a plasma display device (PDP), or an electrophoretic image display device (EPD).

Figure 6:
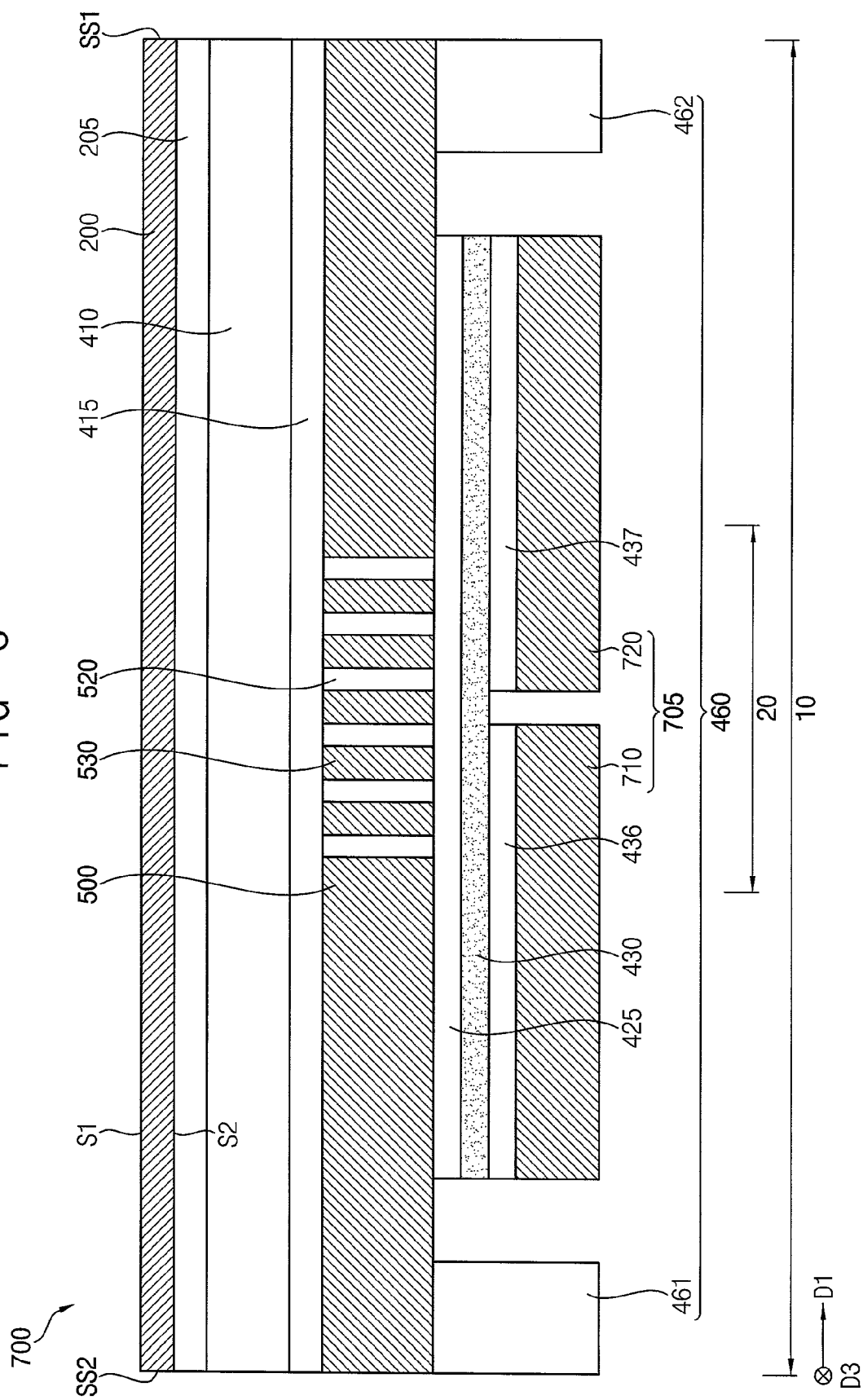
FIG. 6 is a cross-sectional view of a display device according to an exemplary embodiment.

FIG. 6 is a cross-sectional view of a display device according to an exemplary embodiment. A display device 700 illustrated in FIG. 6 may have a configuration substantially identical or similar to the configuration of the display device 100 described with reference to FIGS. 1 to 5, except for a first adhesive member 425, a second adhesive member 415, a third adhesive member 205, a fourth adhesive member 436, a fifth adhesive member 437, and a metal member 705. As such, repeated descriptions of components substantially identical or similar to the components described with reference to FIGS. 1 to 5 will be omitted to avoid redundancy. For example, FIG. 6 shows a state in which the display device 700 is unfolded.

Referring to FIG. 6, the display device 700 may include a display panel 200, a third adhesive member 205, a shock absorbing member 410, a second adhesive member 415, a support member 500, a first adhesive member 425, an elastic member 430, a fourth adhesive member 436, a fifth adhesive member 437, a metal member 705, and a step difference compensation member 460. The display device 700 may include a display area 10 and a foldable area 20. The display area 10 is an area where an image is displayed from the display panel 200, and the foldable area 20 is an area where the display device 700 is folded or unfolded. A portion of the display area 10 may be defined as the foldable area 20. In addition, the step difference compensation member 460 may include a first step difference compensation member 461 and a second step difference compensation member 462, and the metal member 705 may include a first metal member 710 and a second metal member 720. Furthermore, a plurality of openings 535, a plurality of protrusions 530, and a plurality of trenches 520 may be formed in the support member 500.

The first adhesive member 425 may be disposed between the support member 500 and the elastic member 430. In the illustrated exemplary embodiment, a top surface of the first adhesive member 425 may make direct contact with the support member 500, and a bottom surface of the first adhesive member 425 may make direct contact with the elastic member 430. In addition, the first adhesive member 425 may cover the openings 535. The first adhesive member 425 may attach the elastic member 430 onto the bottom surface of the support member 500. In the illustrated exemplary embodiment, the first adhesive member 425 may not be disposed inside each of the openings 535, such that the openings 535 may be configured as empty spaces. While the display device 700 is repeatedly folded and unfolded, the first adhesive member 425 may prevent foreign substances from penetrating into the openings 535 and the trench 520 together with the elastic member 430. In addition, while the display device 700 is repeatedly folded and unfolded, the first adhesive member 425 may be extended and contracted to prevent the openings 535 from being exposed.

The first adhesive member 425 may include an optical clear adhesive (OCA), a pressure sensitive adhesive (PSA), a photocurable resin, a thermosetting resin, etc. For example, the adhesive may include PET, PEN, PP, PC, PS, PSul, PE, PPA, PES, PAR, PCO, MPPO, and the like, and the resin may include an epoxy resin, an amino resin, a phenol resin, a urea resin, a melamine resin, an unsaturated polyester resin, a polyurethane resin, a polyimide resin, and the like.

The second adhesive member 415 may be disposed between the shock absorbing member 410 and the support member 500. In the exemplary embodiments, a top surface of the second adhesive member 415 may make direct contact with the shock absorbing member 410, and a bottom surface of the second adhesive member 415 may make direct contact with the support member 500. In addition, the second adhesive member 415 may cover the openings 535. The second adhesive member 415 may adhere the shock absorbing member 410 onto a top surface of the support member 500. In the exemplary embodiments, the second adhesive member 415 may not be disposed inside each of the openings 535 such that the openings 535 may be configured as empty spaces. The second adhesive member 415 may include an OCA, a PSA, a photocurable resin, a thermosetting resin, etc.

The third adhesive member 205 may be disposed between the display panel 200 and the shock absorbing member 410. In the exemplary embodiments, a top surface of the third adhesive member 205 may make direct contact with the display panel 200, and a bottom surface of the third adhesive member 205 may make direct contact with the shock absorbing member 410. In addition, the third adhesive member 205 may adhere the display panel 200 to the shock absorbing member 410. The third adhesive member 205 may include an OCA, a PSA, a photocurable resin, a thermosetting resin, etc.

The metal member 705 may be disposed on the bottom surface of the elastic member 430. For example, the first metal member 710 may be disposed at a first portion on the bottom surface of the elastic member 430, and the second metal member 720 may be disposed at a second portion of the bottom surface of the elastic member 430. In this case, each of the first and second portions of the elastic member 430 may partially overlap the foldable area 20. In the exemplary embodiments, the first metal member 710 and the second metal member 720 may be spaced apart from each other in the first direction D1. A spaced distance may be determined according to the radius of curvature of the foldable area 20. In the exemplary embodiments, the metal member 705 may prevent the display panel 200 from sagging in the foldable area 20, and may serve to block static electricity, electromagnetic waves, electric fields, magnetic fields, and the like which are generated from an outside. The metal member 705 may include SUS. In some embodiments, the metal member may include Au, Ag, Al, W, Cu, Pt, Ni, Ti, Pd, Mg, Ca, Li, Cr, Ta, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, etc. These may be used alone or in combination with each other. In other exemplary embodiments, a step difference compensation member and an adhesive member may be additionally disposed on a bottom surface of the metal member 705. The adhesive member may make contact with a set member surrounding the display device 700, and the step difference compensation member may prevent the display panel 200 from sagging in the foldable area 20 together with the metal member 705.

The fourth adhesive member 436 may be disposed between the first metal member 710 and the elastic member 430. In the exemplary embodiments, a top surface of the fourth adhesive member 436 may make direct contact with the elastic member 430, and a bottom surface of the fourth adhesive member 436 may make direct contact with the first metal member 710. The fourth adhesive member 436 may adhere the first metal member 710 to the first portion on the bottom surface of the elastic member 430. The fifth adhesive member 437 may be disposed between the second metal member 720 and the elastic member 430. In the exemplary embodiments, a top surface of the fifth adhesive member 437 may make direct contact with the elastic member 430, and a bottom surface of the fifth adhesive member 437 may make direct contact with the second metal member 720. In addition, the fourth adhesive member 436 and the fifth adhesive member 437 may be spaced apart from each other in the first direction D1. The fifth adhesive member 437 may adhere the second metal member 720 to the second portion on the bottom surface of the elastic member 430. Each of the fourth adhesive member 436 and the fifth adhesive member 437 may include an OCA, a PSA, a photocurable resin, a thermosetting resin, etc.

In other exemplary embodiments, a first step difference compensation member may be additionally disposed at the first portion on the bottom surface of the elastic member 430 together with the fourth adhesive member 436, and a second step difference compensation member may be additionally disposed at the second portion on the bottom surface of the elastic member 430 together with the fifth adhesive member 437. The first and second step difference compensation members may prevent the display panel 200 from sagging in the foldable area 20.

The step difference compensation member 460 may be spaced apart from the first adhesive member 425, the elastic member 430, the fourth adhesive member 436, and the metal member 705 on the bottom surface of the support member 500. For example, the first step difference compensation member 461 may be disposed at the first portion on the bottom surface of the support member 500, and the second step difference compensation member 462 may be disposed at the second portion on the bottom surface of the support member 500. In the exemplary embodiments, the bottom surface of the step difference compensation member 460 may be located at the same level as the bottom surface of the metal member 705. The step difference compensation member 460 may prevent the display panel 200 from sagging in a portion where the metal member 705 is not disposed. The step difference compensation member 460 may include PET, PEN, PP, PC, PS, PSul, PE, PPA, PES, PAR, PCO, MPPO, etc. In other exemplary embodiments, an additional adhesive member may be disposed on the bottom surface of the step difference compensation member 460 to make contact with a set member surrounding the display device 700.

The display device 700 according to an exemplary embodiment includes the elastic member 430 disposed on the openings 535 to prevent the openings 535 from being exposed, so that the foreign substances may not be located in the openings 535. In this manner, defects may not occur in the foldable area 20 of the display device 700.

In addition, the display device 700 includes the metal member 705, so that the display panel 200 may be prevented from sagging in the foldable area 20, and static electricity, electromagnetic waves, electric fields, magnetic fields, and the like, which may be generated from the outside, may be blocked.

Figure 7:
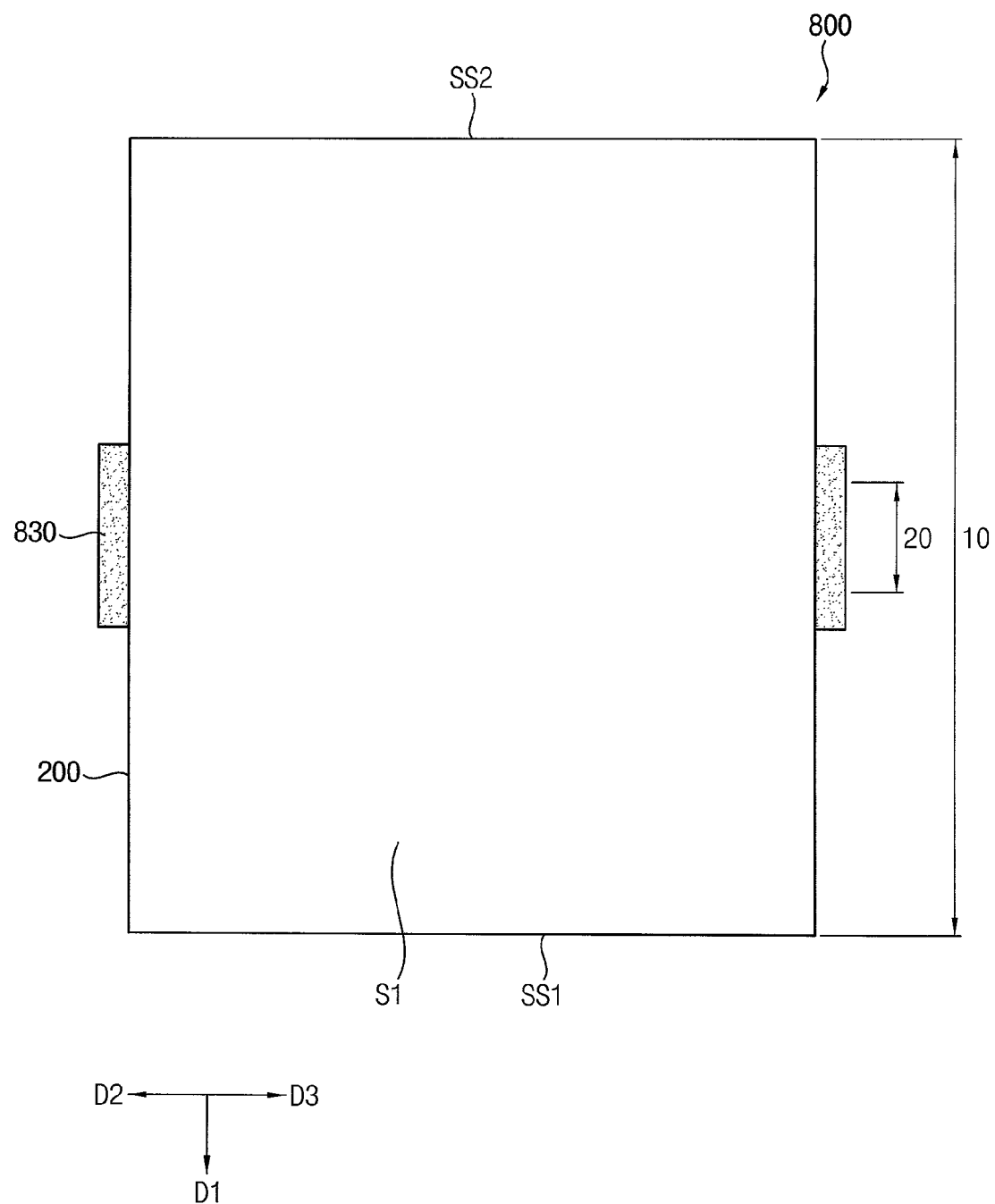
FIG. 7 is a plan view of a display device according to an exemplary embodiment.
Figure 8:
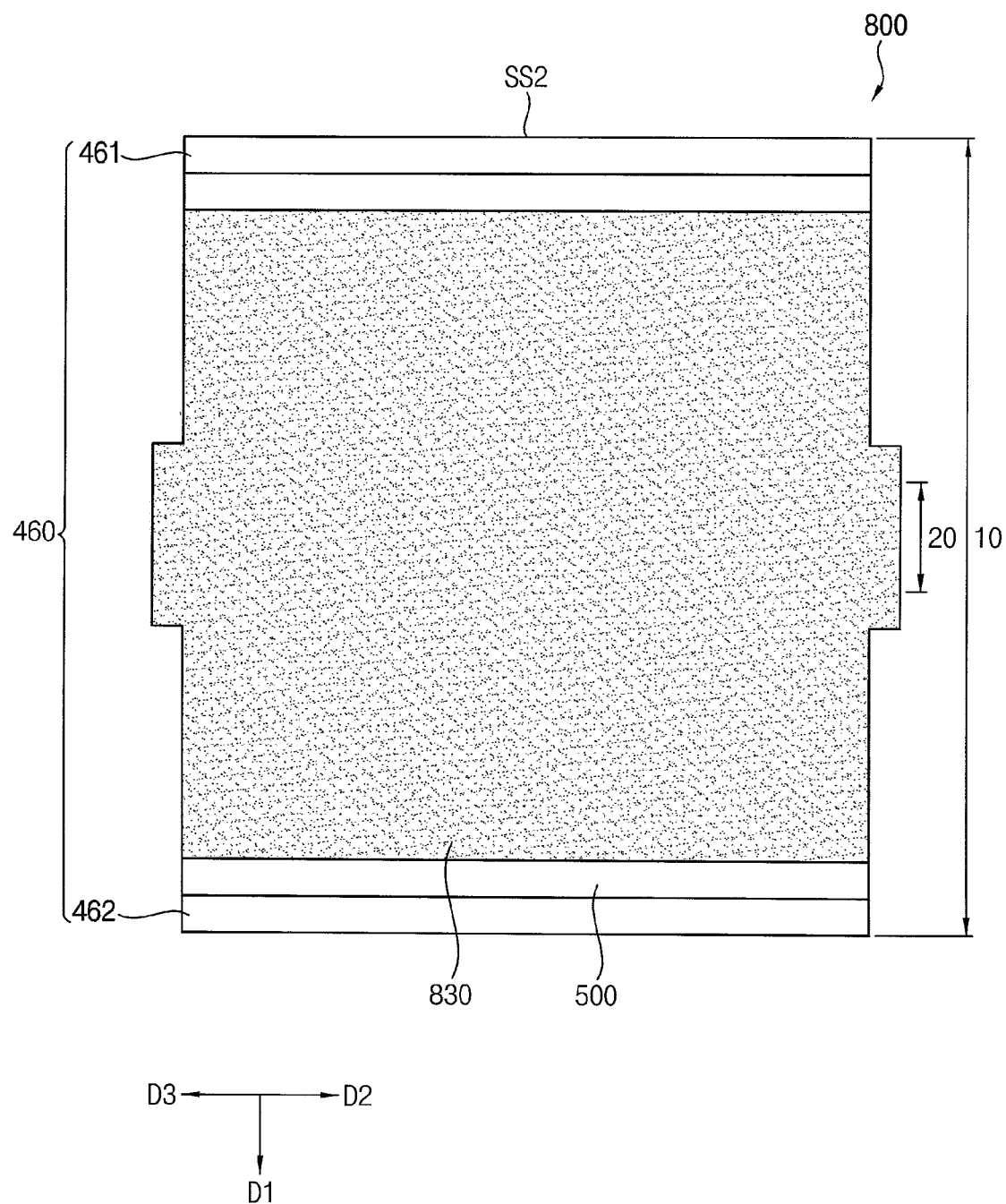
FIG. 8 is a plan view showing a rear side of the display device of FIG. 7.

FIG. 7 is a plan view of a display device according to an exemplary embodiment, FIG. 8 is a plan view showing a rear side of the display device of FIG. 7, and FIG. 9 is a side view showing a lateral side of the display device of FIG. 7. A display device 800 illustrated in FIGS. 7, 8, and 9 may have a configuration substantially identical or similar to the configuration of the display device 100 described with reference to FIGS. 1 to 5, except for an elastic member 830. As such, repeated descriptions of components substantially identical or similar to the components described with reference to FIGS. 1 to 5 will be omitted to avoid redundancy. For example, FIGS. 7, 8, and 9 show a state in which the display device 800 is unfolded.

Referring to FIGS. 7, 8, and 9, the display device 800 may include a display panel 200, a shock absorbing member 410, a support member 500, an elastic member 830, and a step difference compensation member 460. In this case, the display device 800 may include a display area 10 and a foldable area 20. The display area 10 is an area where an image is displayed from the display panel 200, and the foldable area 20 is an area where the display device 800 is folded or unfolded. A portion of the display area 10 may be defined as the foldable area 20. In addition, the step difference compensation member 460 may include a first step difference compensation member 461 and a second step difference compensation member 462. Furthermore, a plurality of openings 535, a plurality of protrusions 530, and a plurality of trenches 520 may be formed in the support member 500.

The elastic member 830 may be disposed at a portion of the bottom surface of the support member 500 and a portion of a side surface of the support member 500. In particular, the elastic member 830 may overlap the trenches 520 in the foldable area 20 on the side surface of the support member 500, while overlapping the openings 535 in the foldable area 20 on the bottom surface of the support member 500. In this manner, the elastic member 830 may prevent the openings 535 and the trenches 520 from being exposed. In the illustrated exemplary embodiment, the elastic member 830 may not be disposed inside each of the openings 535 and the trenches 520, such that the openings 535 and the trenches 520 may be configured as empty spaces. While the display device 800 is repeatedly folded and unfolded, the elastic member 830 may prevent foreign substances from penetrating into the openings 535 and the trenches 520. In addition, while the display device 800 is repeatedly folded and unfolded, the elastic member 830 may be extended and contracted to prevent the openings 535 and the trenches 520 from being exposed. The elastic member 830 may include an elastomer having a relatively large elastic force or a relatively large restoring force. For example, the elastic member 830 may include an elastic material, such as silicone, urethane, or TPU.

The display device 800 according to the illustrated exemplary embodiment includes the elastic member 830, so that the openings 535 and the trenches 520 of the support member 500 may be covered to prevent the foreign substances from being located in the openings 535 and the trenches 520. Accordingly, defects due to the foreign substances may not occur in the display device 800.

The inventive concepts may be applied to various electronic devices including a display device. For example, the inventive concepts may be applied to a vehicle-display device, a ship-display device, an aircraft-display device, portable communication devices, display devices for display or for information transfer, a medical-display device, etc.

As the display device according to the exemplary embodiments includes the elastic member disposed on the openings to prevent the openings from being exposed, the foreign substances may not be located in the openings. Accordingly, defects may not occur in the foldable area of the display device.

In addition, as the display device includes the metal member, the display panel may be prevented from sagging in the foldable area, and static electricity, electromagnetic waves, electric fields, magnetic fields, and the like, which may be generated from the outside, may be blocked.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
a display panel having a foldable area;
a support member disposed on a bottom surface of the display panel and having a folding facilitating structure corresponding to the foldable area; and
an elastic member disposed only on a partial region of a bottom surface of the support member and overlapping the folding facilitating structure,
wherein the folding facilitating structure includes a plurality of openings arranged out of alignment in a first direction parallel to a top surface of the display panel,
wherein at least one of the openings comprises an empty space, and
wherein a thickness of the support member is greater than that of the elastic member.

2. The electronic device of claim 1, wherein the display panel further includes a display area, and a portion of the display area is defined as the foldable area.

3. The electronic device of claim 1, wherein the openings include first to nth openings arranged in the first direction, where n is an integer of 1 or more, and a kth opening is disposed at a position shifted in a second direction perpendicular to the first direction, where k is an even number between 1 and n.

4. The electronic device of claim 3, wherein the support member further includes protrusions disposed in a third direction opposite to the second direction with respect to each of (k−1)th and (k+1)th openings, among the first to nth openings.

5. The electronic device of claim 4, wherein a space between two adjacent protrusions is defined as a trench, and the elastic member extends to a side surface of the support member to cover the trench.

6. The electronic device of claim 1, further comprising:
a first step difference compensation member disposed at a first portion on the bottom surface of the support member; and
a second step difference compensation member disposed at a second portion on the bottom surface of the support member,
wherein the elastic member, the first step difference compensation member, and the second step difference compensation member are disposed at a same level.

7. The electronic device of claim 1, further comprising a first adhesive member disposed between the support member and the elastic member.

8. The electronic device of claim 7, wherein the first adhesive member contacts the support member and the elastic member to overlap the folding facilitating structure.

9. The electronic device of claim 1, further comprising a shock absorbing member disposed between the support member and the display panel.

10. The electronic device of claim 1, further comprising:
a first metal member disposed at a first portion on a bottom surface of the elastic member; and
a second metal member disposed at a second portion on the bottom surface of the elastic member while being spaced apart from the first metal member.

11. The electronic device of claim 10, wherein each of the first and second portions partially overlaps the folding facilitating structure.

12. The electronic device of claim 10, further comprising:
a fourth adhesive member disposed between the first metal member and the elastic member; and
a fifth adhesive member disposed between the second metal member and the elastic member while being spaced apart from the fourth adhesive member.

13. The electronic device of claim 10, further comprising:
a first step difference compensation member disposed at the first portion on a bottom surface of the support member; and
a second step difference compensation member disposed at the second portion on a bottom surface of the support member.

14. The electronic device of claim 13, wherein a bottom surface of each of the first and second step difference compensation members is disposed at a same level as a bottom surface of each of the first and second metal members.

15. A electronic device comprising:
a display panel having a foldable area;
a support member disposed on a bottom surface of the display panel and having a folding facilitating structure corresponding to the foldable area;
an elastic member disposed on a bottom surface of the support member and overlapping the folding facilitating structure;
a shock absorbing member disposed between the support member and the display panel;
a first adhesive member disposed between the shock absorbing member and the support member; and
a second adhesive member disposed between the display panel and the shock absorbing member,
wherein the folding facilitating structure includes a plurality of openings arranged out of alignment in a first direction parallel to a top surface of the display panel.

16. The electronic device of claim 15, wherein the first adhesive member contacts the shock absorbing member and the support member to overlap the folding facilitating structure, and the second adhesive member contacts the display panel and the shock absorbing member.

17. An electronic device comprising:
a display panel having a foldable area;
a support member disposed on a bottom surface of the display panel and having a folding facilitating structure corresponding to the foldable area;
an elastic member disposed on a bottom surface of the support member and overlapping the folding facilitating structure;
a first step difference compensation member disposed at a first portion on the bottom surface of the support member; and
a second step difference compensation member disposed at a second portion on the bottom surface of the support member,
wherein a bottom surface of each of the first and second step difference compensation members is disposed at a same level as a bottom surface of the elastic member,
wherein the folding facilitating structure includes a plurality of openings arranged out of alignment in a first direction parallel to a top surface of the display panel, and
wherein the first step difference compensation member and the second first step difference compensation member are spaced apart from the elastic member.

* * * * *